United States Patent [19]
Cheon

[11] Patent Number: 5,731,954
[45] Date of Patent: Mar. 24, 1998

[54] COOLING SYSTEM FOR COMPUTER

[76] Inventor: Kioan Cheon, 952 SW. Campus Dr. #25C2, Federal Way, Wash. 98023

[21] Appl. No.: 701,346

[22] Filed: Aug. 22, 1996

[51] Int. Cl.$^6$ .................................................. H05K 7/20
[52] U.S. Cl. ................. 361/699; 62/259.2; 174/15.1; 165/80.4; 165/104.33; 257/714; 361/704
[58] Field of Search .................. 62/259.2; 165/80.2, 165/80.4, 122, 137, 104.33; 174/15.1, 16.1; 257/707, 712–714; 361/687, 689, 695–697, 698–699, 701–704, 707, 715; 454/184

[56] References Cited

U.S. PATENT DOCUMENTS

| | | | |
|---|---|---|---|
| 4,315,300 | 2/1982 | Parmerlee et al. | 361/382 |
| 4,434,625 | 3/1984 | Cree | 62/199 |
| 4,535,386 | 8/1985 | Frey, Jr. et al. | 361/389 |
| 4,643,245 | 2/1987 | Smoot, III et al. | 165/47 |
| 4,644,443 | 2/1987 | Swenson et al. | 361/384 |
| 4,739,445 | 4/1988 | Tragen | 361/384 |
| 4,866,743 | 9/1989 | Kroener | 378/4 |
| 5,186,605 | 2/1993 | Tracy | 415/119 |
| 5,195,576 | 3/1993 | Hatada et al. | 165/80.3 |
| 5,243,493 | 9/1993 | Jeng et al. | 361/690 |
| 5,271,239 | 12/1993 | Rockenfeller et al. | 62/259.2 |
| 5,272,599 | 12/1993 | Koenen | 361/710 |
| 5,285,347 | 2/1994 | Fox et al. | 361/385 |
| 5,287,244 | 2/1994 | Hilemn et al. | 361/687 |
| 5,315,480 | 5/1994 | Samarov et al. | 361/705 |
| 5,339,214 | 8/1994 | Nelson | 361/695 |
| 5,365,749 | 11/1994 | Porter | 62/259.2 |
| 5,370,178 | 12/1994 | Agonafer et al. | 165/137 |
| 5,396,775 | 3/1995 | Rockenfeller et al. | 62/112 |
| 5,452,362 | 9/1995 | Burward-Hoy | 381/71 |
| 5,457,342 | 10/1995 | Herbst, II | 257/712 |
| 5,473,508 | 12/1995 | Porter et al. | 361/695 |
| 5,482,113 | 1/1996 | Agonafer et al. | 165/137 |
| 5,566,377 | 10/1996 | Lee | 361/695 |
| 5,646,824 | 7/1997 | Ohashi et al. | 361/699 |

Primary Examiner—Gregory D. Thompson
Attorney, Agent, or Firm—Joan H. Pauly

[57] ABSTRACT

A cooling system for a small computer has one or more heat transfer devices (12, 30) in intimate, heat-exchanging contact with heat-producing computer components. Liquid coolant is circulated through conduits from a reservoir (48) to the devices (12, 30). A radiator (42) is mounted on the outside of the computer housing (7) and is in heat-exchanging contact with the reservoir (48). The contact is preferably provided by a Peltier effect cooling module (46). A pump (P) is positioned in the reservoir casing (50) to pump the coolant. A brushless electric motor is mounted on the casing (50) to power the pump (P). The reservoir (48) has an upstream portion (58) and a downstream portion (60). Coolant is directed through the upstream portion (58) past heat-gathering fins (64) and into the downstream portion (60).

11 Claims, 3 Drawing Sheets

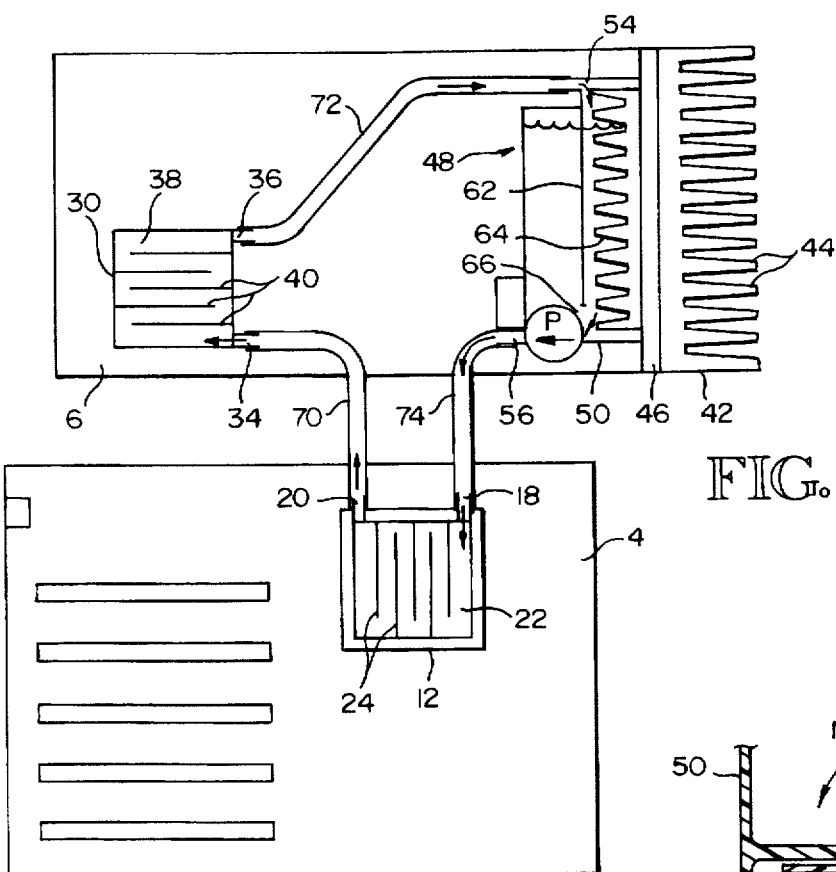
FIG. 2
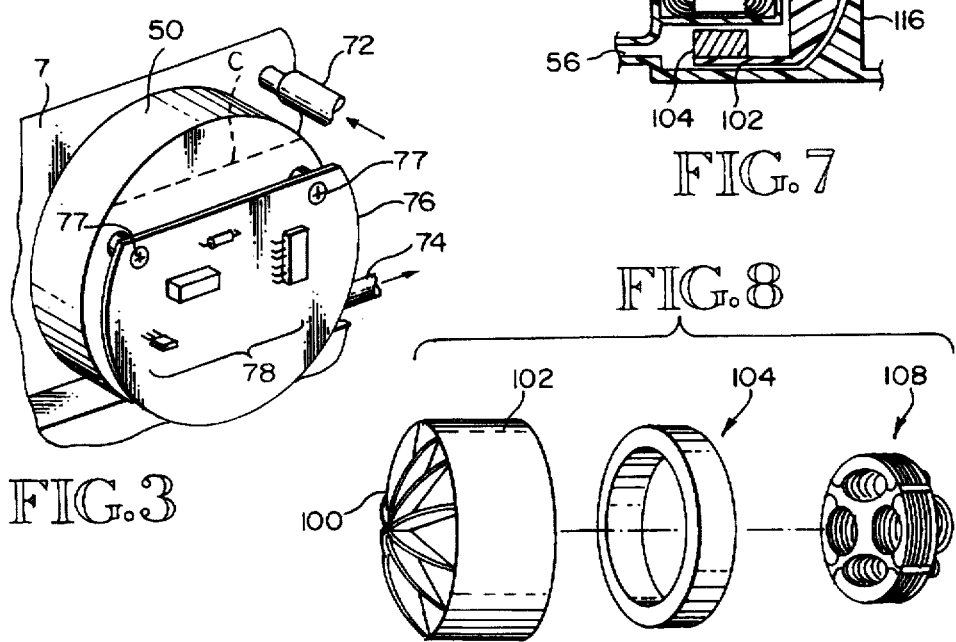
FIG. 3
FIG. 7
FIG. 8

COOLING SYSTEM FOR COMPUTER

TECHNICAL FIELD

This invention relates to cooling systems for computers and, more particularly, to such a system having a heat transfer device contacting a computer component and communicating with a liquid coolant reservoir via first and second conduits, a radiator mounted on the outside of the computer housing and in heat exchanging contact with the reservoir, and a pump and brushless motor therefor mounted on the reservoir casing.

BACKGROUND OF THE INVENTION

It is well known that computers commonly include components that produce heat. Various types of cooling systems have been proposed for removing heat from the computer components to maintain the computer within operating temperature limits. The proposed systems include passive cooling systems and systems that employ gaseous and/or liquid coolants actively brought into heat transfer contact with the heat-generating components. There are a number of drawbacks associated with the presently known systems. These include noise and dust associated with systems having fans to create an airstream for cooling computer components or other elements (e.g., radiators) of the cooling system. They also include lack of sufficient cooling capacity or bulkiness and/or complexity resulting from efforts to increase cooling capacity.

The principal object of the present invention is to provide a cooling system for computers that avoids the drawbacks discussed above and is especially appropriate for use with small computers, including personal computers, workstations, servers, and small mainframes.

SUMMARY OF THE INVENTION

The present invention is directed toward a cooling system for a computer having a housing and at least one heat-producing component mounted inside the housing. According to an aspect of the invention, the system comprises a heat transfer device having an outer surface in intimate contact with a complementary outer surface of the component. The device has an internal passageway extending between an inlet port and an outlet port. A radiator is mounted on the outside of the housing and has a plurality of heat transfer fins exposed to ambient air outside the housing. A reservoir is in heat exchanging contact with the radiator and extends into the housing. The reservoir has a casing, an inlet opening in the casing, and an outlet opening in the casing spaced from the inlet opening. A first conduit extends between the outlet port of the heat transfer device and the inlet opening of the reservoir. A second conduit extends between the outlet opening of the reservoir and the inlet port of the heat transfer device. A pump is positioned in the casing of the reservoir adjacent to the outlet opening to pump liquid coolant from the reservoir out through the outlet opening and to the heat transfer device through the second conduit. A brushless electric motor is mounted on the casing to power the pump.

The manner in which the reservoir and radiator are in heat exchanging contact may be varied. Preferably, the reservoir is in heat exchanging contact with the radiator via a Peltier effect cooling module. The module is positioned between and is in intimate contact with the reservoir and the radiator. This arrangement provides a high level of efficiency in the heat exchange and also helps maximize the compactness of the cooling system.

The details of the structure of the reservoir may also be varied. Preferably, the interior space defined by the reservoir casing includes an upstream portion and a downstream portion. An internal divider wall substantially separates the upstream and downstream portions. The upstream portion is in communication with the inlet opening, and the downstream portion is in communication with the outlet opening. A plurality of heat-gathering fins are located in the upstream portion. The divider wall has a passage therethrough communicating the upstream portion and the downstream portion. The passage is positioned so that liquid coolant entering the interior space through the inlet opening passes through the upstream portion by and through the heat-gathering fins and then flows through the passage into the downstream portion and out the outlet opening.

The cooling system of the invention is versatile and may serve to cool one or a plurality of components of the computer. In a preferred arrangement, the system comprises a second heat transfer device having an outer surface in intimate contact with a complementary outer surface of a second heat-producing component. The second heat transfer device has an internal passageway extending between an inlet port and an outlet port. One of the first and second conduits includes the internal passageway of the second heat transfer device. Two types of computer components that may be cooled by use of the system are microprocessors and power supply components. A power supply component may comprise, for example, a heat sink to which one or more heat generating semiconductor components are mounted to transfer heat from the semiconductor components to the heat sink. A more specific example is a plurality of rectifiers mounted on a heat sink.

Various types of motors may be used in the cooling system. In one embodiment, the motor is mounted inside the casing. The casing includes an inner cage. The motor includes a stator coil and core portion positioned inside the cage to isolate the stator coil and core portion from liquid coolant in the reservoir. In another embodiment, the motor includes a magnet mounted inside the casing and a coil mounted outside the casing to isolate the coil from coolant. Preferably, a mounting plate is secured to an outside surface of the casing and has a mounting surface confronting the outside surface. The coil is secured to the mounting surface.

The cooling system of the invention has a number of advantages. The pump motor arrangement and the lack of a fan for moving air allow the system to operate essentially noise and dust free. The system has good cooling capacity and is highly versatile. The system may be installed either as part of original equipment or retrofitted into existing computers. Because of the relative simplicity and compact structure of the elements of the system, the system is especially well-adapted for use with small computers, such as personal computers, workstations, servers, and small mainframes. Whatever type of computer the system is installed in, the system provides reliable and low cost cooling. These and other advantages and features will become apparent in the detailed description of the best modes for carrying out the invention that follows.

BRIEF DESCRIPTION OF THE DRAWINGS

In the drawings, like element designations refer to like parts throughout, and:

FIG. 2 is a schematic flow diagram of the system shown in FIG. 1.

3

Figure 1:
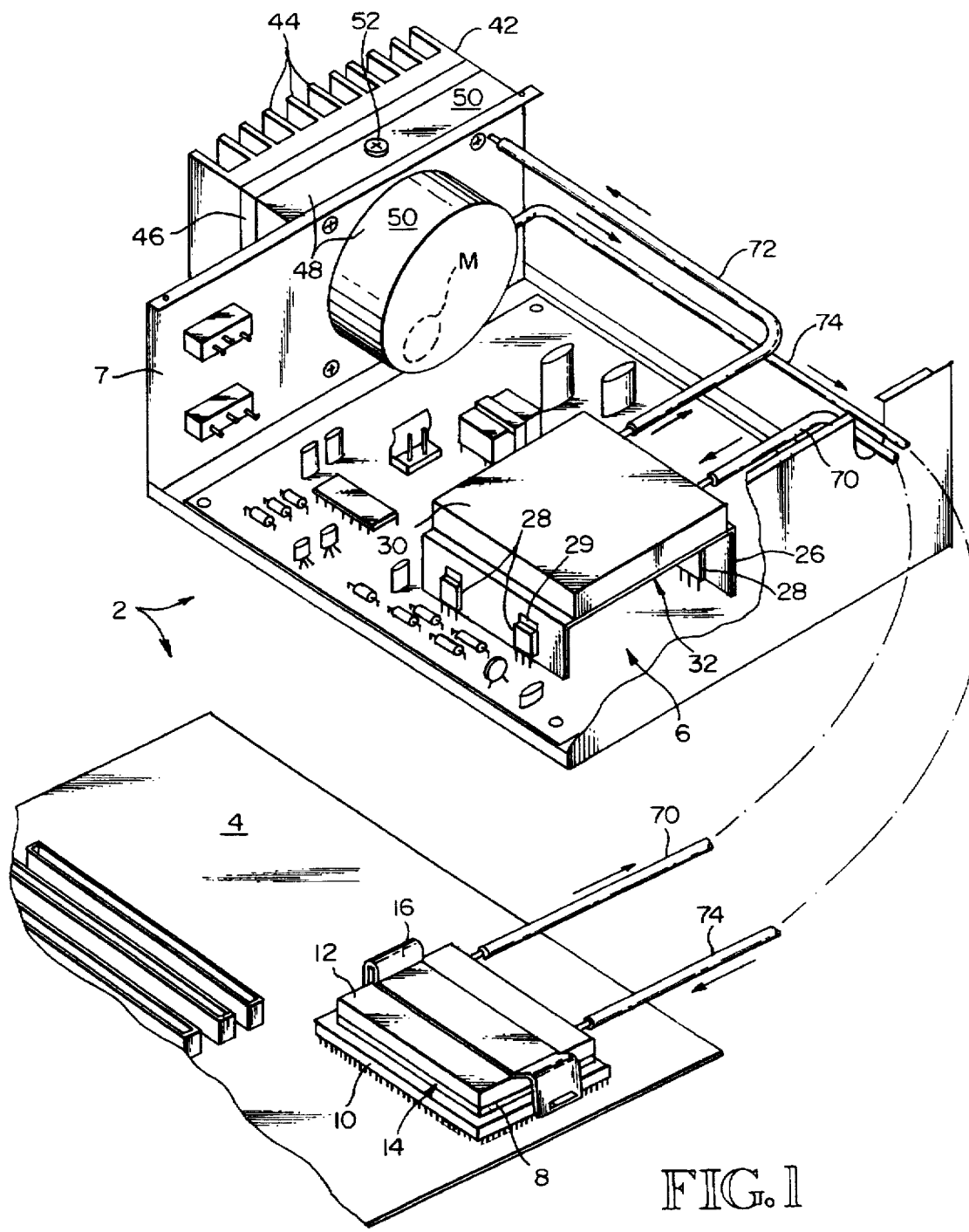
FIG. 1 is a partially schematic, fragmentary and partially exploded pictorial view of a generalized embodiment representing the two preferred embodiments of the invention.

FIG. 3 is a fragmentary pictorial view of a part of the reservoir housing shown in FIG. 1, with additional details shown.

Figure 4:
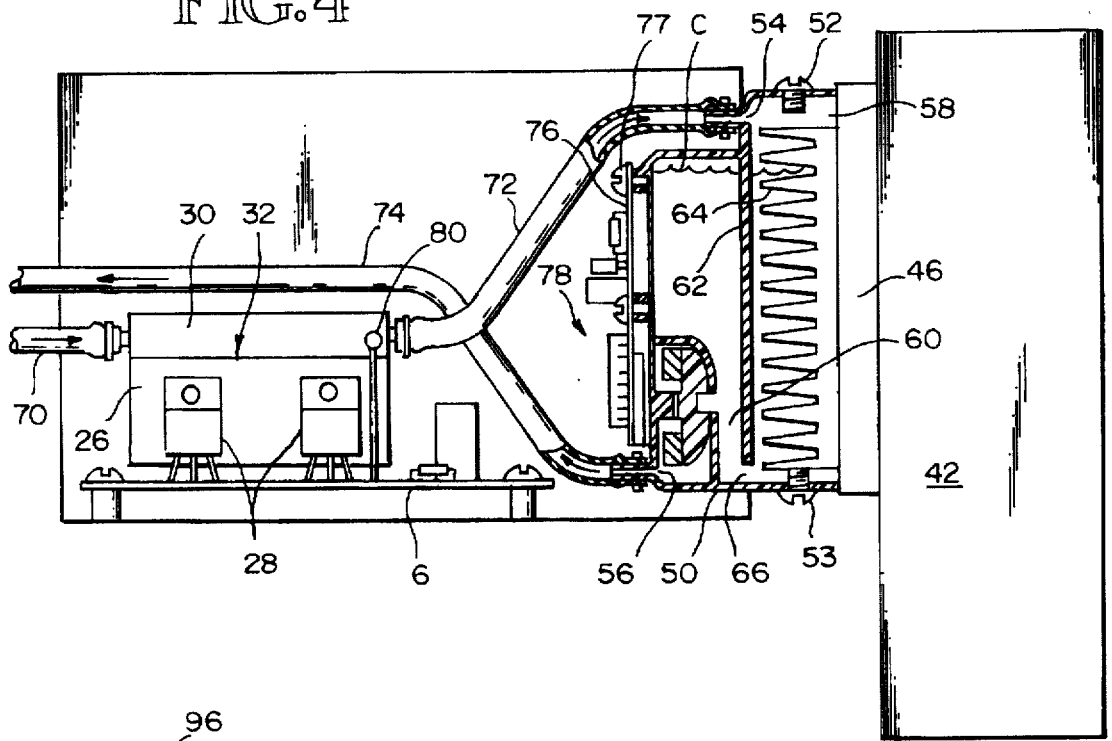

FIG. 4 is a partially schematic elevational view of a first preferred embodiment, with parts shown in section.

Figure 5:
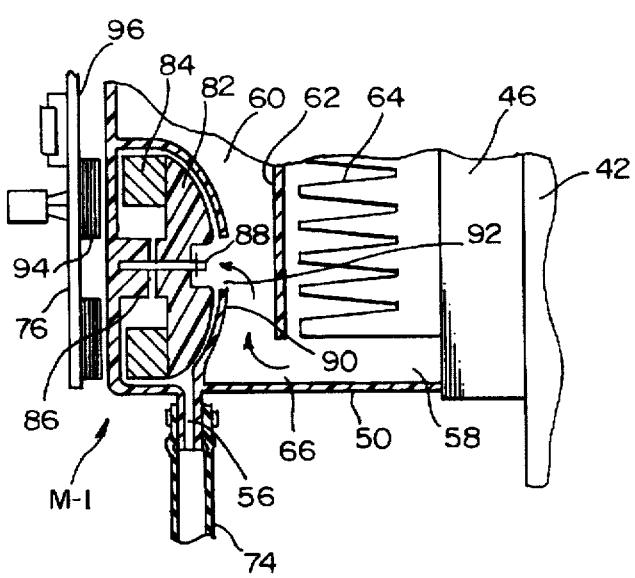

FIG. 5 is an enlargement of a portion of FIG. 4 showing the motor structure in more detail.

Figure 6:
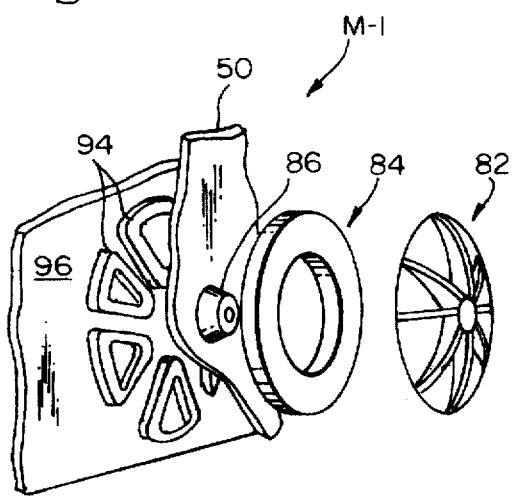

FIG. 6 is a fragmentary exploded pictorial view of the motor components shown in FIGS. 4 and 5.

FIG. 7 is a sectional view showing a second preferred embodiment of the motor portion of the system.

FIG. 8 is an exploded pictorial view of elements of the motor shown in FIG. 7.

BEST MODES FOR CARRYING OUT THE INVENTION

The drawings show two embodiments of a cooling system for computers that are instructed according to the invention and constitute the best modes for carrying out the invention currently known to the applicant. In the drawings, the cooling system is shown being used in a small computer 2 having a mother board 4 and a power supply 6 that, in the assembled computer, are mounted in a housing 7. It is anticipated that the primary use for the system of the invention will be in computers of the type shown in FIG. 1 and similar computers. However, it is intended to be understood that the system may also be used to advantage in other types of computers.

Referring to FIG. 1, the mother board 4 is shown outside the housing 7. This partially exploded view of the computer 2 has been chosen to facilitate illustration of the computer 2, its components, and the elements of the cooling system. In the type of computer 2 illustrated, the mother board 4 would commonly be housed inside the same housing 7 as the power supply 6.

Still referring to FIG. 1, the mother board 4 has a plurality of components mounted thereon, including a microprocessor chip 8. The chip 8 is connected to the board 4 through a socket 10. In accordance with the invention, a heat transfer device 12 is mounted on the chip 8 to remove excess heat from the chip 8. In order to accomplish heat transfer from the chip 8 to the device 12, the device 12 has an outer surface in intimate contact with a complementary outer surface of the chip 8. In the illustrated configuration, the device 12 has a flat lower surface that is in contact with a flat upper surface of the chip 8 along an interface 14. The intimate contact between the two surfaces is maintained by a spring clip 16.

FIG. 2 shows schematically the interior configuration of the heat transfer device 12. The device 12 has a hollow interior with an inlet port 18 and an outlet port 20. A serpentine internal passageway 22 extends between the inlet port 18 and the outlet port 20. The device 12 has interior walls 24 extending between the top and bottom walls of the device 12 and alternately from opposite sidewalls of the device 12 into the interior space. Each interior wall 24 is spaced from the sidewall opposite the sidewall from which it extends to allow liquid coolant flowing through the passageway 22 to flow around the free end of the interior wall 24. Thus, the serpentine passageway 22 is formed by the interior walls 24 along with the exterior sidewalls and top and bottom walls of the device 12.

Referring again to FIG. 1, the power supply 6 of the computer 2 includes a number of components, most of which are not relevant to the description of the invention. The components include a heat sink 26 to which a plurality

4 of heat-producing rectifiers 28 are mounted. Three of the rectifiers 28 are visible in FIG. 1. Each rectifier 28 has a rear mounting plate portion 29 that provides a heat transfer interface between the rectifier 28 and the heat sink 26. In the context of the cooling system of the invention, the heat sink 26 together with the rectifiers 28 may be viewed as a single computer component that is cooled by the system. A heat transfer device 30 is mounted on the heat sink 26 to cool the component 26, 28. The heat sink 26 has a flat horizontal top to which the heat transfer device 30 is attached and opposite downwardly depending legs to which the rectifiers 28 are attached. As in the case of the first heat transfer device 12 discussed above, the second heat transfer device 30 has a flat heat-transferring interface 32 with the top of the heat sink 26. Intimate contact between the heat sink 26 and device 30 may be maintained by a heat transfer adhesive. Alternatively, a spring clip, such as one of the type 16 shown in connection with the chip 8, may be used for maintaining the intimate heat-transferring contact.

Referring to FIG. 2, the internal structure of the second heat transfer device 30 is essentially the same as that of the first heat transfer device 12. The second device 30 has a hollow interior with an inlet port 34 and an outlet port 36. A serpentine internal passageway 38 extends from the inlet port 34 to the outlet port 36. As in the device 12, the passageway 38 is formed by the outer walls of the device 30 and internal walls 40.

The computer 2 and the heat-producing components 8 and 26, 28 illustrated and described herein are only examples of the various types of computers and heat-producing components that may advantageously be cooled by the system of the invention. It is intended to be understood that the system may be used in connection with a wide variety of computers and heat-producing components. In addition, the system may be used to cool a single component or two or more components in accordance with the needs in a particular installation.

Referring to FIGS. 1 and 2, The cooling system also includes a radiator 42 mounted on the outside of the computer housing 7. The radiator 42 has a plurality of outwardly projecting fins 44 that are exposed to ambient air outside the housing 7 to dissipate heat into the air. As shown, the fins 44 are parallel spaced-apart members. However, as used herein, the term "fins" is intended to include various other surface configurations that provide increased surface area for heat dissipation, as well as the illustrated configuration of parallel or substantially parallel surfaces.

The radiator 42 is in heat exchanging contact with the casing 50 of a reservoir 48. For this purpose, the molded plastic casing 50 has an outer metal wall. The contact is preferably provided by a Peltier effect cooling module 46 that is positioned between the radiator 42 and the reservoir 48 and is in intimate contact with the radiator 42 and the metal wall of the reservoir 48. As can be seen in FIGS. 1 and 4, the reservoir 48 has a rectangular external portion and a cylindrical portion that extends inwardly through the computer housing 7 and into the interior of the computer 2. The external portion of the reservoir 48 has an upper fill opening 52 and a lower drain opening 53 for filling the reservoir 48 with liquid coolant C and draining coolant C therefrom.

The internal structure of the reservoir 48 can be seen in FIGS. 2, 4, and 5. The reservoir 48 has an inlet opening 54 and an outlet opening 56 extending through the casing 50 at spaced-apart locations. As can be seen by a comparison of FIGS. 4 and 5, the orientation of the outlet opening 56 may be varied. The interior space of the reservoir 48 is divided into an upstream portion 58 in communication with the inlet opening 54 and a downstream portion 60 in communication with the outlet opening 56. An internal divider wall 62 substantially separates the two interior portions 58, 60. As can best be seen in FIG. 4, the upstream portion 58 is in the rectangular reservoir portion exterior to the computer housing 7, and the downstream portion 60 is in the cylindrical reservoir portion inside the computer housing 7. A plurality of spaced-apart heat-gathering fins 64 extend inwardly toward the computer housing from the metal outer reservoir wall that interfaces with the Peltier effect cooling module 46. The fins 64 extend into the upstream portion 58 of the reservoir interior space.

The divider wall 62 has a passage 66 extending therethrough and communicating the upstream portion 58 with the downstream portion 60. The passage 66 is positioned so that liquid coolant C entering the interior space of the reservoir through the inlet opening 54 passes through the upstream portion 58 by and through the heat-gathering fins 64 and then flows through the passage 66 into the downstream portion 60 and out the outlet opening 56. As the coolant C flows by the fins 64, heat that has been transferred to the coolant C from the computer components 8 and 26, 28 by the heat transfer devices 12, 30 is transferred from the coolant C to the fins 64. The transferred heat is then transferred from the fins 64 to the exterior radiator 42 through the Peltier effect cooling module 46.

Like the radiator fins 44 described above, the internal heat-gathering reservoir fins 64 are illustrated as being in the form of substantially parallel spaced-apart members. It is intended to be understood that the term "fins", as used herein in connection with either the radiator fins 44 or the reservoir fins 64, includes other types of structures that provide increased surface area for heat transfer as well as the literally described and illustrated structures of substantially parallel members.

As shown in FIGS. 1 and 2, the heat transfer devices 12, 20 are connected to the reservoir 48 by means of a plurality of conduits. A first conduit 70 extends from the outlet port 20 of the first heat transfer device 12 to the inlet port 34 of the second heat transfer device 30. A second conduit 72 extends from the outlet port 36 of device 30 to the inlet opening 54 of the reservoir 48. A third conduit 74 extends from the outlet opening 56 of the reservoir 48 to the inlet port 18 of the device 12. Liquid coolant C is circulated from the reservoir 48 to the heat transfer devices 12, 30 and back to the reservoir 48 through the conduits 70, 72, 74. The coolant may be water, automotive radiator fluid, or some other liquid capable of transferring heat. For the purpose of illustrating the basic structure of the invention, the first conduit 70, the internal passageway 38 through the device 30 and the second conduit 72 may be viewed as a single conduit from the outlet port 20 of the device 12 to the inlet opening 54 of the reservoir 48. Similarly, the third conduit 74, internal passageway 22 of device 12 and first conduit 70 may be viewed as a single conduit communicating the outlet 56 of the reservoir 48 with the inlet 34 of the second device 30.

Referring to FIG. 2, a pump P is positioned inside the casing 50 of the reservoir 48 adjacent to the outlet opening 56. The pump P is positioned to pump liquid coolant C from the reservoir 48, out through the outlet opening 56 and to the heat transfer devices 12, 30. The pump P is powered by a brushless electric motor M mounted on the casing 50. The general location of the motor M is shown in broken lines in FIG. 1.

Referring to FIGS. 3–5, a mounting plate 76 is secured to the vertical inwardly-facing (relative to the computer) outer surface of the cylindrical portion of the reservoir casing 50 by fasteners 77. The plate 76 serves as a circuit board for the motor control circuit 78. The circuit 78 controls circulation of coolant C based on feedback from one or more sensors indicating the temperatures of the components to which heat transfer devices are attached. FIG. 4 illustrates a thermistor 80 mounted on the second heat transfer device 30. The thermistor 80 monitors the temperature of the device 30 and provides feedback to the circuit 78. When the temperature is below a predetermined level, the pump P may be shut down, assuming that the temperature at the microprocessor component 8 is within limits, to prevent unnecessary operation of the cooling system. When the temperature at the thermistor 80 rises above the predetermined level, the circuit 78 causes the pump P to be operated to circulate coolant C and bring the temperature down below the predetermined level.

As noted above, the structure of the motor M may be varied without departing from the spirit and scope of the invention. There are currently two types of motors that are considered preferred forms. FIGS. 4–6 show a first preferred embodiment of the motor M-1. Referring to FIGS. 4–6, the undersurface of a molded plastic pump propeller 82 has an annular permanent magnet 84 secured thereto. An axial stem 86 formed integrally with the molded plastic reservoir casing 50 extends inwardly from the inner surface of the casing 50 toward the hub of the propeller 82. A fastener 88 extends through the propeller hub into the stem 86 to secure the propeller 82 and magnet 84 to the casing 50. The stem 86 serves both to mount the propeller 82 and to space the undersurface of the propeller 82 from the inner surface of the casing 50 to thereby provide an annular space for the magnet 84.

A dome-like rounded cover and fluid guide 90 substantially surrounds the propeller 82, magnet 84, and stem 86. The cover and guide 90 is preferably made of molded plastic and preferably is an integral part of the casing 50. The cover and guide 90 may be integrally molded with the casing 50 or, to facilitate assembly of the elements of the system, may be molded separately from the casing 50 and then integrally joined with the casing 50 by use of an adhesive or other bonding procedure. A central opening 92 in the cover and guide 90 allows coolant C that has entered the downstream portion 60 of the interior space of the reservoir 48 from the upstream portion 58 to enter the space inside the cover and guide 90 and be directed by the propeller 82 out through the outlet opening 56. The outlet opening 56 opens onto the space inside the cover and guide 90. This arrangement allows the coolant C to contact the magnet 84 and ensures that efficient pumping action of coolant C out through the outlet opening 56 is accomplished.

The motor M-1 also includes a coil 94 mounted outside the reservoir casing 50 to isolate the coil 94 from liquid coolant C in the reservoir 48. Referring to FIG. 5, the coil 94 is secured to a mounting surface 96 of the mounting plate 76 that confronts the outside surface of the reservoir casing 50. The coil 94 is positioned to confront the magnet 84 to allow the motor M-1 to operate in a known manner.

FIGS. 7 and 8 show a second preferred embodiment of the motor M-2. In this embodiment, the motor M-2 is mounted inside the casing 50. The pump propeller 100 is formed on a first closed end of a molded plastic cylindrical magnet mount 102. The opposite end of the mount 102 is open, and an annular magnet 104 is secured to the inner cylindrical surface adjacent to the open end. The casing 50 includes an integral inner cage 106 that forms an enclosed rectangular space in which the stator coil and core 108 of the motor M-2 is located to isolate the coil and core 108 from the coolant C. A fastener 110 extends through a bronze sleeve 112 at the hub of the propeller 100 and down into the cage wall 106. A pair of washers 114 on opposite ends of the sleeve 112 serve to retain the sleeve 112 and space it from the cage 106. This arrangement provides mounting of the propeller 100 and magnet 104 on the cage 106 and permits the propeller 100 and magnet 104 to rotate freely relative to the cage 106.

As in the case of the motor M-1, in the arrangement shown in FIG. 7, a rounded cover and fluid guide 116 substantially surrounds the propeller 100, the cylindrical mount 102 and the cage 106. A central opening 118 in the cover and fluid guide 116 draws coolant C into the space defined by the cover and guide 116 to efficiently direct coolant C out through the outlet opening 56, which opens through the casing 50 into the space inside the cover and guide 90. The magnet 104 is exposed to coolant C entering the cover and guide 90 to allow cooling of the magnet 104 by the coolant C, if necessary.

Although the preferred embodiments of the invention have been illustrated and described herein, it is intended to be understood by those skilled in the art that various modifications and omissions in form and detail may be made without departing from the spirit and scope of the invention as defined by the following claims. The claims are to be interpreted in accordance with established rules, including the doctrine of equivalents.

What is claimed is:

1. A cooling system for a computer having a housing and at least one heat-producing component mounted inside the housing, comprising:

a heat transfer device having an outer surface in intimate contact with a complementary outer surface of the component, and an internal passageway extending between an inlet port and an outlet port;

a radiator mounted on the outside of the housing and having a plurality of heat transfer fins exposed to ambient air outside the housing;

a reservoir in heat exchanging contact with the radiator and extending into the housing, said reservoir having a casing, an inlet opening in the casing, and an outlet opening in the casing spaced from the inlet opening;

a first conduit extending between the outlet port of said heat transfer device and the inlet opening of the reservoir;

a second conduit extending between the outlet opening of the reservoir and the inlet port of said heat transfer device;

a pump positioned in the casing of the reservoir adjacent to the outlet opening to pump liquid coolant from the reservoir out through the outlet opening and to said heat transfer device through the second conduit; and a brushless electric motor mounted on the casing to power the pump.

2. The cooling system of claim 1, in which the reservoir is in heat exchanging contact with the radiator via a Peltier effect cooling module positioned between and in intimate contact with the reservoir and the radiator.

3. The cooling system of claim 2, in which the casing of the reservoir defines an interior space; and the reservoir includes an internal divider wall substantially separating the interior space into an upstream portion in communication with the inlet opening and a downstream portion in communication with the outlet opening, and a plurality of heat-gathering fins in the upstream portion; said divider wall having a passage therethrough communicating the upstream portion and the downstream portion and positioned so that liquid coolant entering the interior space of the reservoir through the inlet opening passes through the upstream portion by and through the heat-gathering fins and then flows through the passage into the downstream portion and out the outlet opening.

4. The cooling system of claim 1, in which the casing of the reservoir defines an interior space; and the reservoir includes an internal divider wall substantially separating the interior space into an upstream portion in communication with the inlet opening and a downstream portion in communication with the outlet opening, and a plurality of heat-gathering fins in the upstream portion; said divider wall having a passage therethrough communicating the upstream portion and the downstream portion and positioned so that liquid coolant entering the interior space of the reservoir through the inlet opening passes through the upstream portion by and through the heat-gathering fins and then flows through the passage into the downstream portion and out the outlet opening.

5. The cooling system of claim 1, in which the computer has a second heat-producing component; the system comprises a second heat transfer device having an outer surface in intimate contact with a complementary outer surface of the second component, and an internal passageway extending between an inlet port and an outlet port; and one of said conduits includes the internal passageway in said second heat transfer device.

6. The cooling system of claim 5, in which said components include a microprocessor and a power supply component, respectively.

7. The cooling system of claim 6, in which said power supply component comprises a heat sink and a plurality of rectifiers mounted on and in heat transfer contact with the heat sink, said second heat transfer device being in intimate contact with the heat sink.

8. The cooling system of claim 1, in which the motor is mounted inside the casing.

9. The cooling system of claim 8, in which the casing includes an inner cage, and the motor includes a stator coil and core portion positioned inside the cage to isolate the stator coil and core portion from liquid coolant in the reservoir.

10. The cooling system of claim 1, in which the motor includes a magnet mounted inside the casing and a coil mounted outside the casing to isolate the coil from liquid coolant in the reservoir.

11. The cooling system of claim 10, comprising a mounting plate secured to an outside surface of the casing and having a mounting surface confronting said outside surface, said coil being secured to said mounting surface.

* * * * *